(12) United States Patent
Fan et al.

(10) Patent No.: US 9,521,218 B1
(45) Date of Patent: Dec. 13, 2016

(54) ADAPTIVE COMPRESSION AND TRANSMISSION FOR BIG DATA MIGRATION

(71) Applicant: International Business Machines Corporation, Armonk, NY (US)

(72) Inventors: Liya Fan, Beijing (CN); Yong Deng Hu, Beijing (CN); He Yuan Huang, Beijing (CN); Chen Tian, Beijing (CN); Jian Wang, Beijing (CN); Zhe Yan, Beijing (CN); Ke Zhang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/002,421

(22) Filed: Jan. 21, 2016

(51) Int. Cl.
*G06F 15/16* (2006.01)
*H04L 29/06* (2006.01)
*H04L 29/08* (2006.01)
*H03M 7/30* (2006.01)
*H03M 7/40* (2006.01)

(52) U.S. Cl.
CPC ............ *H04L 69/04* (2013.01); *H03M 7/3059* (2013.01); *H03M 7/40* (2013.01); *H04L 67/06* (2013.01)

(58) Field of Classification Search
CPC ........ H03M 7/30; H03M 7/3091; H03M 7/40; H03M 7/3059; H04L 69/04; H04L 67/06
See application file for complete search history.

(56) References Cited

U.S. PATENT DOCUMENTS

| 7,930,436 | B1* | 4/2011 | Znosko | H04L 69/04 330/252 |
|---|---|---|---|---|
| 8,553,759 | B2 | 10/2013 | Fallon et al. | |
| 8,819,110 | B2 | 8/2014 | Jin | |
| 8,933,825 | B2 | 1/2015 | Fallon | |
| 8,949,488 | B2* | 2/2015 | Swift | H04L 67/1095 710/2 |
| 2008/0025298 | A1* | 1/2008 | Lev-Ran | H04L 69/04 370/389 |
| 2013/0094356 | A1 | 4/2013 | Keith et al. | |
| 2014/0098859 | A1* | 4/2014 | Lim | H04N 19/13 375/240.12 |

(Continued)

FOREIGN PATENT DOCUMENTS

WO 2014155490 A1 10/2014

OTHER PUBLICATIONS

"Bzip2", Copyright © 1996-2015, printed on Oct. 22, 2015, 1 page, <http://www.bzip.org/>.

(Continued)

*Primary Examiner* — Mohamed Wasel
(74) *Attorney, Agent, or Firm* — Fusheng Xu (57) ABSTRACT

A method for optimizing migration efficiency of a data file over network is provided. Specifically, a total time of compression time of the data file, transfer time of the data file over the network, and decompression time of the data file, is minimized by adaptively selecting compression methods to compress each data block of the data file. For selecting a compression method for a data block, information entropy of the data block is analyzed, and a real status of computing and system resources is considered. Further, trade-off among the resource usage, compassion speed and compression ratio is made to calculate an optimized transmission solution over the network for each data block of the data file.

20 Claims, 6 Drawing Sheets

(56) References Cited

U.S. PATENT DOCUMENTS

| | | | | |
|---|---|---|---|---|
| 2014/0132429 A1* | 5/2014 | Scoville | ............... | H03M 7/30 |
| | | | | 341/87 |
| 2014/0195498 A1* | 7/2014 | Asher | ............... | H03M 7/4037 |
| | | | | 707/693 |
| 2014/0244604 A1* | 8/2014 | Oltean | ............... | H03M 7/30 |
| | | | | 707/693 |
| 2015/0149739 A1* | 5/2015 | Seo | ............... | G06F 3/0608 |
| | | | | 711/162 |
| 2015/0301946 A1* | 10/2015 | Guo | ............... | G06F 9/45558 |
| | | | | 711/6 |

OTHER PUBLICATIONS

"Deflate", Wikipedia, the free encyclopedia, This page was last modified on Oct. 20, 2015, 5 pages, <https://en.wikipedia.org/wiki/DEFLATE>.

"Aspera high-speed transfer", IBM Software, printed on Oct. 22, 2015, 1 page, <http://www-01.ibm.com/software/info/aspera/>.

"Lzo for Windows", sourceforge.net, printed on Oct. 22, 2015, 1 page, <http://gnuwin32.sourceforge.net/packages/lzo.htm>.

"Snappy by google", A fast compressor/decompressor, page generated by GitHub Pages, printed on Oct. 22, 2015, 1 page, <http://google.github.io/snappy/>.

\* cited by examiner

ADAPTIVE COMPRESSION AND TRANSMISSION FOR BIG DATA MIGRATION

BACKGROUND

The present invention relates generally to the field of cloud computing, and more particularly to big data management.

Generally speaking, cloud computing means storing and accessing data and programs over the Internet, that is, the on-demand delivery of IT resources and applications via the Internet with only pay for what you use. Cloud computing provides a way for enabling ubiquitous, convenient, on-demand network access to a shared pool of configurable computing resources (e.g., networks, servers, storage, applications and services) that can be rapidly provisioned and released with minimal management effort.

Big data usually includes data sets with sizes beyond the ability of commonly used software tools to capture, curate, manage, and process data within a tolerable elapsed time. Accuracy in big data may lead to more confident decision making. And better decisions can mean greater operational efficiency, cost reduction and reduced risk. Challenges associated with big data include analysis, capture, data curation, search, sharing, storage, transfer, visualization, and information privacy.

SUMMARY

In one aspect of the present invention, a method is provided comprising: identifying an information entropy of a first data block having a block size; receiving a real-time resource status of a system, wherein the system includes a first computer, a second computer, and a communication channel having a bandwidth between the first computer and the second computer; determining a first preferred compression method to compress the first data block based at least in part on the information entropy and the real-time resource status; generating a compressed first data block according to the first preferred compression method; transferring the compressed first data block over the communication channel from the first computer to the second computer; and decompressing the compressed first data block upon arriving at the second computer.

DETAILED DESCRIPTION

Enabling optimized big data migration between systems over network is provided that leverages compression and decompression. Specifically, central processing unit (CPU) and/or memory usage of a source system and a target system, as well as a network bandwidth, are all considered to minimize a total time of the big data migration including a compression time of the big data, a transmission time of the big data over the network, and a decompression time of the big data. The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium, or to an external computer or external storage device via a network, for example, the Internet, a local area network, a wide area network, and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network, and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture, including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions, or acts, or carry out combinations of special purpose hardware and computer instructions.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 1:
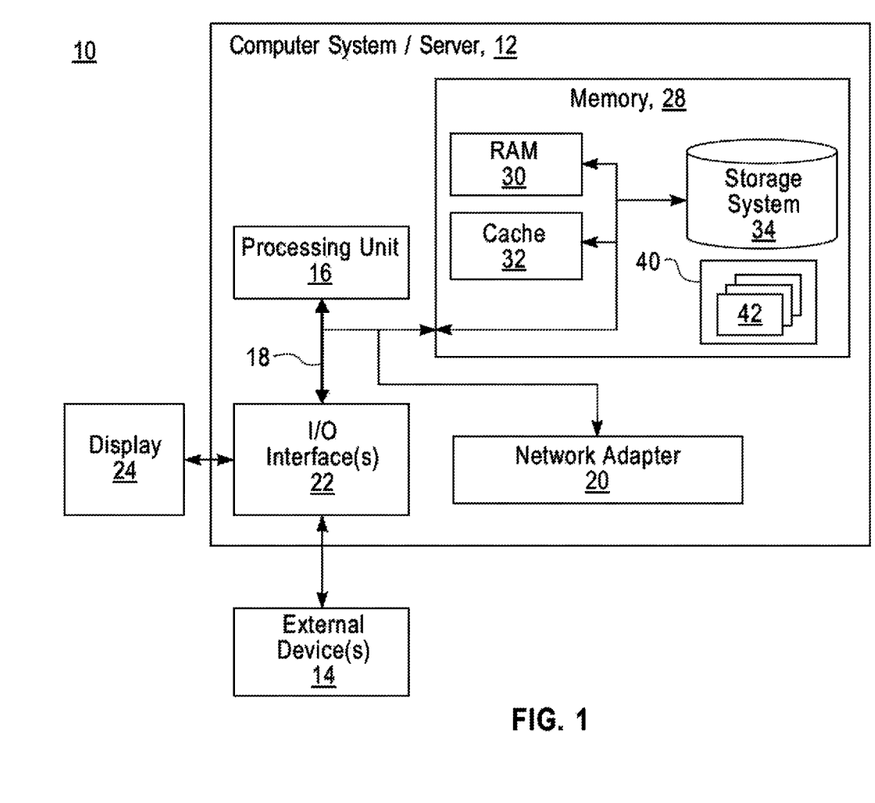
FIG. 1 depicts a cloud computing node used in a first embodiment of a system according to the present invention.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples include, but are not limited to: microcode, device drivers, redundant processing units, external disk drive arrays, RAID systems, tape drives, and data archival storage systems, etc.

Figure 2:
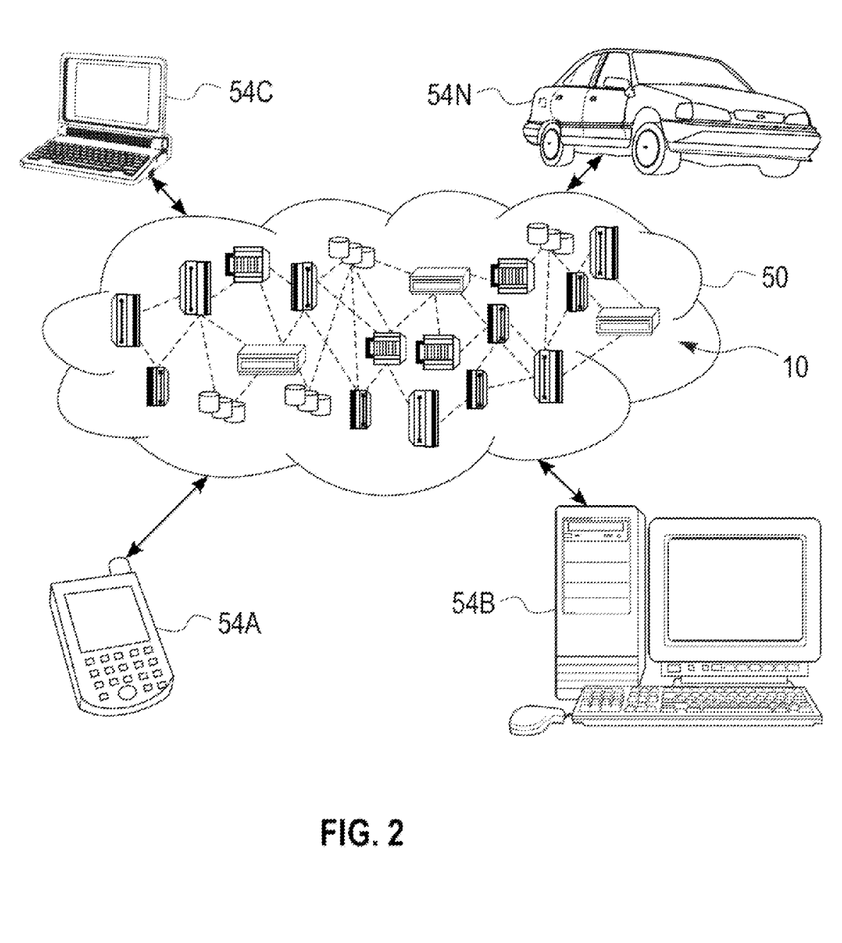
FIG. 2 depicts an embodiment of a cloud computing environment (also called the "first embodiment system") according to the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
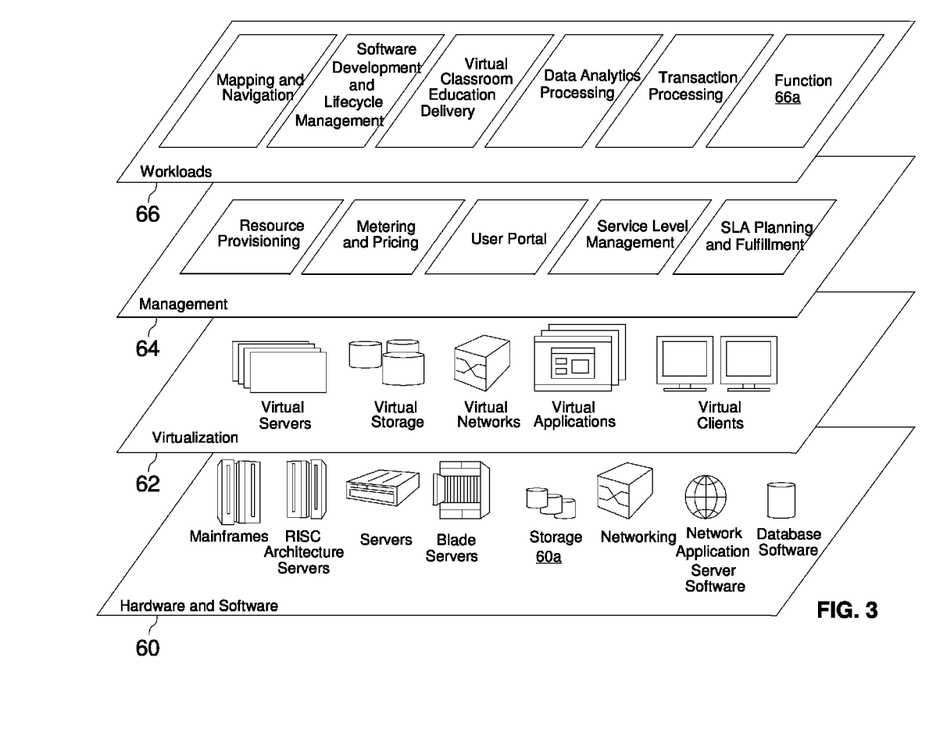
FIG. 3 depicts abstraction model layers used in the first embodiment system.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include mainframes; RISC (Reduced Instruction Set Computer) architecture based servers; storage devices; networks and networking components. In some embodiments software components include network application server software.

Virtualization layer 62 provides an abstraction layer from which the following examples of virtual entities may be provided: virtual servers; virtual storage; virtual networks, including virtual private networks; virtual applications and operating systems; and virtual clients.

In one example, management layer 64 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 66 provides examples of functionality for which the cloud computing environment may be utilized. Examples of workloads and functions which may be provided from this layer include: mapping and navigation; software development and lifecycle management; virtual classroom education delivery; data analytics processing; transaction processing; and functionality according to the present invention (see function block 66a).

Figure 4:
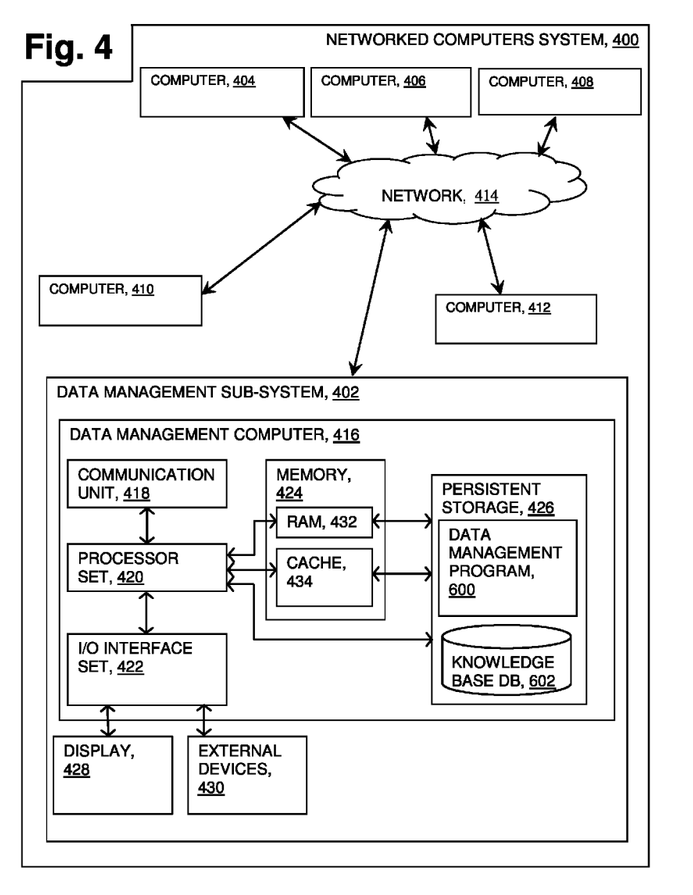
FIG. 4 is a schematic view of a second embodiment of a system according to the present invention.

While a cloud-based system is described above, additional embodiments of the present invention may be practiced in a traditional networked computer systems, as described in detail below with respect to FIGS. 4-6.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Some embodiments of the present invention will now be described in detail with reference to the Figures. FIG. 4 is a functional block diagram illustrating various portions of networked computers system 400, in accordance with one embodiment of the present invention, including: data management sub-system 402; computers 404, 406, 408, 410, 412; communication network 414; data management computer 416; communication unit 418; processor set 420; input/output (I/O) interface set 422; memory device 424; persistent storage device 426; display device 428; external device set 430; random access memory (RAM) devices 432; cache memory device 434; data management program 600; and knowledge base database 602.

Sub-system 402 is, in many respects, representative of the various computer sub-system(s) in the present invention. Accordingly, several portions of sub-system 402 will now be discussed in the following paragraphs.

Sub-system 402 may be a laptop computer, tablet computer, netbook computer, personal computer (PC), a desktop computer, a personal digital assistant (PDA), a smart phone, or any programmable electronic device capable of communicating with the client sub-systems via network 414. Program 600 is a collection of machine readable instructions and/or data that is used to create, manage, and control certain software functions that will be discussed in detail below.

Sub-system 402 is capable of communicating with other computer sub-systems via network 414. Network 414 can be, for example, a local area network (LAN), a wide area network (WAN) such as the Internet, or a combination of the two, and can include wired, wireless, or fiber optic connections. In general, network 414 can be any combination of connections and protocols that will support communications between server and client sub-systems.

Sub-system 402 is shown as a block diagram with many double arrows. These double arrows (no separate reference numerals) represent a communications fabric, which provides communications between various components of sub-system 402. This communications fabric can be implemented with any architecture designed for passing data and/or control information between processors (such as microprocessors, communications and network processors, etc.), system memory, peripheral devices, and any other hardware component within a system. For example, the communications fabric can be implemented, at least in part, with one or more buses.

Memory 424 and persistent storage 426 are computer readable storage media. In general, memory 424 can include any suitable volatile or non-volatile computer readable storage media. It is further noted that, now and/or in the near future: (i) external device(s) 430 may be able to supply, some or all, memory for sub-system 402; and/or (ii) devices external to sub-system 402 may be able to provide memory for sub-system 402.

Program 600 is stored in persistent storage 426 for access and/or execution by one or more of the respective computer processors 204, usually through one or more memories of memory 424. Persistent storage 426: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 426. Alternatively, program 600 operates in a cloud computing environment and is stored, for example, in storage 60a (FIG. 3) within hardware and software layer 60 of cloud computing environment 50.

Program 600 may include both machine readable and performable instructions, and/or substantive data (that is, the type of data stored in a database). In this particular embodiment, persistent storage 426 includes a magnetic hard disk drive. To name some possible variations, persistent storage 426 may include a solid state hard drive, a semiconductor storage device, read-only memory (ROM), erasable programmable read-only memory (EPROM), flash memory, or any other computer readable storage media that is capable of storing program instructions or digital information.

The media used by persistent storage 426 may also be removable. For example, a removable hard drive may be used for persistent storage 426. Other examples include optical and magnetic disks, thumb drives, and smart cards that are inserted into a drive for transfer onto another computer readable storage medium that is also part of persistent storage 426.

Communications unit 418, in these examples, provides for communications with other data processing systems or devices external to sub-system 402. In these examples, communications unit 418 includes one or more network interface cards. Communications unit 418 may provide communications through the use of either, or both, physical and wireless communications links. Any software modules discussed herein may be downloaded to a persistent storage device (such as persistent storage device 426) through a communications unit (such as communications unit 418).

I/O interface set 422 allows for input and output of data with other devices that may be connected locally in data communication with computer 416. For example, I/O interface set 422 provides a connection to external device set 430. External device set 430 will typically include devices such as a keyboard, keypad, a touch screen, and/or some other suitable input device. External device set 430 can also include portable computer readable storage media such as, for example, thumb drives, portable optical or magnetic disks, and memory cards. Software and data used to practice embodiments of the present invention, for example, program 600, can be stored on such portable computer readable storage media. In these embodiments the relevant software may (or may not) be loaded, in whole or in part, onto persistent storage device 426 via I/O interface set 422. I/O interface set 422 also connects in data communication with display device 428.

Display device 428 provides a mechanism to display data to a user and may be, for example, a computer monitor or a smart phone display screen.

Data management program 600 operates to achieve a maximum or preferred migration efficiency of big data between a source computer (e.g., one or more of computers 404, 406, 408, 410, and 412) and a target computer (e.g., data management computer 416) over a network (e.g., network 414), which applies self-adaptive compression/decompression for the big data. That is, a global optimization is performed to minimize a total time of migration for the big data, herein the total time refers to the total of compression time of the big data, transmission time of the big data over the network, and decompression time of the big data. Program 600 may run on a computer server (e.g., data management computer 416 in FIG. 4), and/or on one or more of computers 404, 406, 408, 410, and 412 in FIG. 4.

Big data migration is challenging and critical in many scenarios, especially in cloud based scenarios. Some embodiments of the present invention recognize the following facts, potential problems and/or potential areas for improvement with respect to the current state of the art: (i) uploading big data to the cloud is a bottleneck of cloud computing (e.g., 10 GB wordcount benchmark: uploading data takes 10 min, computation takes 3 min); (ii) MapReduce shuffling is the bottleneck of MapReduce jobs (e.g., the size of intermediate data is similar or larger than input data); (iii) for sensor data for IoT (internet of things), each vehicle periodically sends its data (GPS, oil consumption, etc.) to a central server where the total data may be large (e.g., thousands of vehicles, millions of points); and/or (iv) for virtual machine (VM) migration/duplication, a typical VM image size is ~100 GB. Common characteristics of these scenarios include: (i) they are a client/server pattern: client (sender) and server (receiver); (ii) system resources change dynamically (e.g., in hadoop clusters, data nodes and task tracker may be on the same node, and in Internet, the network bandwidth between two peers changes dynamically); and/or (iii) network transmission is based on block (e.g., in HDFS (hadoop distributed file system), data are organized as blocks of size 64 MB).

To support high efficiently transfer of big data from one place to another place, conventionally, protocol based approach is applied, which is independent of the traditional TCP/IP protocols and mainly designed for WAN (wide area network) migration of big data. Further conventional methods for efficiently transferring big data include data compression based methods, which further categorized as compression techniques that have high compression factors (e.g., the total time including compression time, transferring time and decompression time may be too long) and compression techniques that achieve tradeoff between the total time and compression factor (however, they may under-use or over-use system resources, like CPU, memory, etc.)

Some embodiments of the present invention provide a method for achieving a maximum, preferred, or optimized migration efficiency of big data through self-adaptive compression methods, that is, a global optimization is performed to minimize the total time of migration of big data over a network (i.e., a minimal total time of compression time, transmission time over the network and decompression time). A compression method and the corresponding decompression method are chosen for the data based on real time system resources and information entropy of data. Information entropy (more specifically, Shannon entropy) is the expected value (average) of the information contained in each message/data. Such real time system resources include, but not limited to, the CUP and memory of a source computer/node form which the data is sent (also referred to a sender node or client), the CPU and memory of a target computer/node at which the data is received (also referred to as a receiver node or a server), and the network bandwidth over which the data is transferred. Further, in some embodiments of the present invention, execution record is collected in both the client and the server in order to select an optimal compression method and a set of parameters associated with the selected compression method.

In some embodiments of the present invention, statistics-based compression techniques are employed. But for a file having fairly long words or phrases, the statistics method deals with a large frequency table which utilizes more memory resource. Further, a long time for searching consumes more CUP usage that results in a low compression/decompression speed. Even further, the low information entropy leads to a high compression factor. Herein the compression factor is the number of bits in a compressed data divided by the number of bits in the original data corresponding to the compressed data. A compression ratio, which is often used, is the inverse of the compression factor; it is usually expressed as a percentage. In some embodiments of the present invention, dictionary-based compression techniques may be utilized. Dictionary-based compression algorithms usually create a dictionary (a pattern of characters) in memory as data is scanned looking for repeated information. Based on the pattern recognition (a look-up in the dictionary), that string of information is replaced by a much shorter but uniquely identifiable string. This results in a compression of that overall data. However, a large sliding window is associated with the dictionary-base methods that consumes large computer memory. Further, a long time for matching results in more CPU usage and further low compression or decompression speed. Also, a low information entropy leads to a high compression factor. As such, a trade-off between resource utilization, compression speed, and compression factor is desired to minimize or optimize the total time of compression time, transmission time, and decompression time, which requires an adaptive selection of desirable compression methods and the associated compression/decompression parameters.

Figure 5:
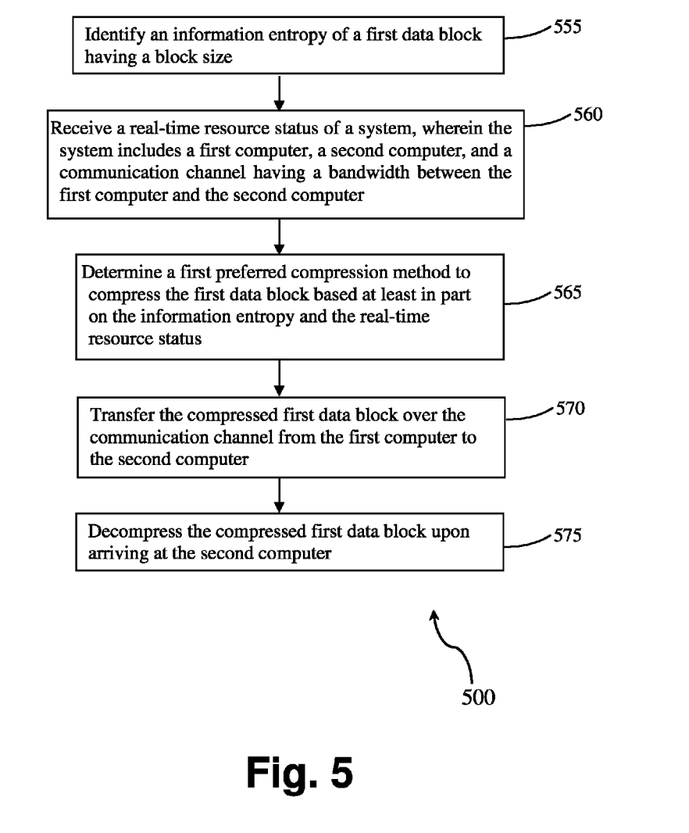
FIG. 5 is a flowchart showing a method performed, at least in part, by the second embodiment system.
Figure 6:
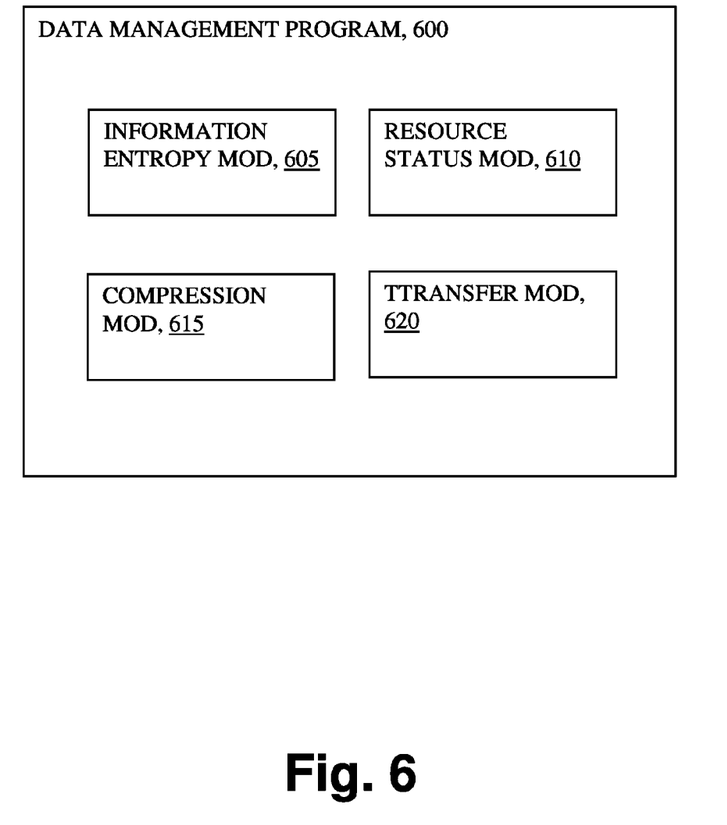
FIG. 6 is a schematic view of a machine logic (for example, software) portion of the second embodiment system.

Referring now to FIG. 5 shows flowchart 500 depicting a first method according to the present invention. FIG. 6 shows program 600 for performing at least some of the method steps of flowchart 500.

Processing begins at step 555, where information entropy module "mod" 605 identifies an information entropy of a first data block having a block size. In this example, one of computers 404, 406, 408, 410, 412, for example computer 404 as a client, sends a data file to the data management computer 416 that serves as a server receiving the data file over the network 414. The data file may be a TB level huge file stored in multiple data blocks, for example, one block has 512 MB or 1024 MB. Different data blocks usually have different data density in temporal, spatial or other dimensions. For example, a web crawler can crawl many data from web sites, and these data can be packaged in a tar package and uploaded to a big data platform for analysis. The web sites can have text, images, audio/video, etc., so in different blocks of the tar package, the information density is totally different, which can significantly impact compression ratio/rate and compression time of the tar package. Information density of data becomes more and more important when a data size increase; it cannot be ignored for big data. In this example, the information density of each data block of the data file is measured using information entropy of the corresponding data block.

Processing proceeds to step 560, where resource status module 610 receives a real-time resource status of a system, wherein the system includes a first computer, a second computer, and a communication channel having a bandwidth between the first computer and the second computer. In this example, the system is the networked computer system 400, as shown in FIG. 4. The first computer is computer 404, the second computer is data management computer 416, and the communication channel is network 414. In this step, the real-time/current resource status of the system is collected, including, but not limited to: (i) available resource of central processing unit (CPU) of the first computer (computer 404); (ii) available resource of memory of the first computer (computer 404); (iii) available resource of CPU of the second computer (computer 416); (iv) available resource of memory of the second computer (computer 416); and/or (v) available resource of the bandwidth of the communication channel (network 414). Alternatively, the real-time status of the system may be obtained from a database, such as knowledge base database 602, where the system resource status is tracked and stored.

Processing proceeds to step 565, where compression module 615 determines a first preferred compression method to compress the first data block based at least in part on the information entropy and the real-time resource status. In this example, the data file to be transferred is a big file comprising multiple data blocks. The data file is transferred block by block. For each data block, a preferred compression method may be selected from a set of candidate compression methods to optimize the migration efficiency of the data file, that is, adaptively choose a suitable compression method for each data block of the data file.

Specifically, in some embodiments of the present invention, multiple (de)compression algorithms are adaptively selected from multiple candidate algorithms for a big file to be transferred. For different data blocks of the big file, different compression algorithms can be evaluated and a best one is selected dynamically. The goal is to ensure the overall transfer time for the whole big file the shortest.

In this example, to determine a preferred compression method including an algorithm and associated partakers for the first data block, the information entropy of the first data block, the block size of the first data block, the real-time status of the system, and the bandwidth of the communication channel are utilized to calculate for a set of candidate compression methods one or more of a predicted compression rate (PCR) of the first data block, a predicted compression time (PCT) of the first data block, a predicted transfer time (PTT) of the first data block, and a predicted decompression time (PDT) of the first data block. A best/preferred compression method can be selected for the first data block from the set of candidate compression methods by identifying a minimum total value of the estimated/predicted compression time, the estimated/predicted decompression time and the estimated/predicted transmission/transfer time.

Alternatively, the compression rate/ratio, the compression time, and the decompression time for each candidate compression method may be obtained by accessing the knowledge base database 602 into which input the information entropy of the first data block, the size of the first data block, the available CPU and memory resource of the first computer/sender, and the available CPU and memory resource of the second computer/receiver.

In some embodiments of the present invention, the knowledge base database includes information entropy of data block, block size of data block, CPU configuration for compression, CPU configuration for decompress, memory configuration for compression, memory configuration for decompression, algorithms of compression methods, and/or algorithms parameters of compression methods. The knowledge base database may further include compress rate of compression method for a data block, compression time of compression method for a data block, and decompression time of compression method for a data block.

In some embodiments of the present invention, knowledge base is based on following understanding: (i) information entropy is a function of input data block, that is, information entropy=F(input data block); (ii) a compression method (including algorithm and algorithm parameters) is a function of system resource and block size, that is, compression method=F(system resource, block size); and/or (iii) expected/predicted compress rate, compress time, decompress time is a function of information entropy, compression method and system resource, that is, expected compress rate=function(information entropy, compression method, system resource), expected compress time=function(information entropy, compression method, system resource), expected decompress time=function(information entropy, compression method, system resource).

Processing proceeds to step 570, where transfer module 620 transfers the compressed first data block over the communication channel from the first computer to the second computer. Once a preferred compression method is selected for the first data block, the first data block is compressed by the preferred compression method. In this step, the compressed first data block is transferred/transmitted over network 414 from computer 404 to computer 416.

Processing ends at step 575, where compression module 615 decompress the compressed first data block upon arriving at the second computer. In this example, upon arriving of the compressed first data block at computer 416, the compressed first data block is decompressed using the decompression algorithm corresponding to the preferred compression method used for compressing the first data block.

Some embodiments of the present invention further include collecting a real/actual compression rate (RCR), a real compression time (RCT), a real transfer time (RTT), and a real decompression time (RDT) of data block that completes migration. To optimize transfer efficiency, for different data blocks to be transferred, evaluation is performed to identify whether to keep using a previous compression algorithm for current data blocks, in other words, whether to use a current compression algorithm for a next data block. For example, upon completing migration of the current data block, the preferred compression method selected for the current data block is reevaluated to determine whether it is still suitable for a next data block to be transferred. The decision is made by evaluating the formula below:

$$D=\sqrt{(RCT-PCT)^2+(RTT-PTT)^2+(RDT-PDT)^2}$$

where D is a distance between a PCT, a PTT, a PDT, and the RCT, the RTT, the RDT. If the distance is bigger than a threshold that is preset by a user and/or the system, it indicates the previous compression algorithm is not suitable for a current data density (i.e., a current data block), a current computation/system resource, and a current I/O resource. A new algorithm should be selected for the current data block. Otherwise, the previous algorithm is used for a current/next data block.

Some embodiments of the present invention may include one, or more, of the following features, characteristics and/or advantages: (i) the cross-block transfer of data efficiency can be optimized; (ii) global optimization is performed to minimize the total migration time of a data file by using information entropy of each data block, computing/system resources, and trade-off among the resource usage, compassion speed and compression ratio; (iii) the real transmission/migration of data file is monitored; (iv) compression algorithm and parameters are adaptively selected for data blocks of a data file demand; and/or (v) it is suitable for transmission/migration of big data among networks.

Some helpful definitions follow:

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

What is claimed is:

1. A method, the method comprising:
   identifying an information entropy of a first data block having a block size;
   receiving a real-time resource status of a system, wherein the system includes a first computer, a second computer, and a communication channel having a bandwidth between the first computer and the second computer;
   determining a first preferred compression method to compress the first data block based at least in part on the information entropy and the real-time resource status;
   generating a compressed first data block according to the first preferred compression method;
   transferring the compressed first data block over the communication channel from the first computer to the second computer; and
   decompressing the compressed first data block upon arriving at the second computer.

2. The method of claim 1, wherein the real-time resource status of a system includes available resource of central processing unit (CPU) of the first computer, available resource of memory of the first computer, available resource of CPU of the second computer, available resource of memory of the second computer, and available resource of the bandwidth of the communication channel.

3. The method of claim 1, wherein the first preferred compression method includes an algorithm and an algorithm parameter.

4. The method of claim 1, wherein the step of determining a first preferred compression method is performed by using a member of the group consisting of:
the information entropy of the first data block,
the block size of the first data block,
the real-time status of the system,
the bandwidth of the communication channel,
a predicted compression rate (PCR) of the first data block,
a predicted compression time (PCT) of the first data block,
a predicted transfer time (PTT) of the first data block, and
a predicted decompress time (PDT) of the first data block.

5. The method of claim 4, further comprising:
identifying, for the first data block, a real compression rate (RCR), a real compression time (RCT), a real transfer time (RTT), and a real decompression time (RDT).

6. The method of claim 5, further comprising:
determining a distance (D) between the PCT, the PTT, the PDT, and the RCT, the RTT, the RDT.

7. The method of claim 6, further comprising:
determining, for a second data block, a second preferred compression method in response to the distance being greater than a preset threshold.

8. A computer program product comprising a non-transitory computer readable storage medium having a set of instructions stored therein which, when executed by a processor, causes the processor to compress adaptively and transmit big data by:
identifying an information entropy of a first data block having a block size;
receiving a real-time resource status of a system, wherein the system includes a first computer, a second computer, and a communication channel having a bandwidth between the first computer and the second computer;
determining a first preferred compression method to compress the first data block based at least in part on the information entropy and the real-time resource status;
generating a compressed first data block according to the first preferred compression method;
transferring the compressed first data block over the communication channel from the first computer to the second computer; and
decompressing the compressed first data block upon arriving at the second computer.

9. The computer program product of claim 8, wherein the real-time resource status of a system includes available resource of central processing unit (CPU) of the first computer, available resource of memory of the first computer, available resource of CPU of the second computer, available resource of memory of the second computer, and available resource of the bandwidth of the communication channel.

10. The computer program product of claim 8, wherein the first preferred compression method includes an algorithm and an algorithm parameter.

11. The computer program product of claim 8, wherein the step of determining a first preferred compression method is performed by using a member of the group consisting of:
the information entropy of the first data block,
the block size of the first data block,
the real-time status of the system,
the bandwidth of the communication channel,
a predicted compression rate (PCR) of the first data block,
a predicted compression time (PCT) of the first data block,
a predicted transfer time (PTT) of the first data block, and
a predicted decompress time (PDT) of the first data block.

12. The computer program product of claim 11, further comprising:
identifying for the first data block a real compression rate (RCR), a real compression time (RCT), a real transfer time (RTT), and a real decompression time (RDT).

13. The computer program product of claim 12, further comprising:
determining a distance (D) between the PCT, the PTT, the PDT, and the RCT, the RTT, the RDT.

14. The computer program product of claim 13, further comprising:
determining for a second data block a second preferred compression method in response to the distance being greater than a preset threshold.

15. A computer system comprising:
a processor set; and
a computer readable storage medium;
wherein:
the processor set is structured, located, connected, and/or programmed to run program instructions stored on the computer readable storage medium; and
the program instructions which, when executed by the processor set, cause the processor set to compress adaptively and transmit big data by:
identifying an information entropy of a first data block having a block size;
receiving a real-time resource status of a system, wherein the system includes a first computer, a second computer, and a communication channel having a bandwidth between the first computer and the second computer;
determining a first preferred compression method to compress the first data block based at least in part on the information entropy and the real-time resource status;
generating a compressed first data block according to the first preferred compression method;
transferring the compressed first data block over the communication channel from the first computer to the second computer; and
decompressing the compressed first data block upon arriving at the second computer.

16. The computer system of claim 15, wherein the first preferred compression method includes an algorithm and an algorithm parameter.

17. The computer system of claim 15, wherein the step of determining a first preferred compression method is performed by using a member of the group consisting of:
the information entropy of the first data block,
the block size of the first data block,
the real-time status of the system,
the bandwidth of the communication channel,
a predicted compression rate (PCR) of the first data block,
a predicted compression time (PCT) of the first data block,
a predicted transfer time (PTT) of the first data block, and
a predicted decompress time (PDT) of the first data block.

18. The computer system of claim 17, further comprising:
identifying for the first data block a real compression rate (RCR), a real compression time (RCT), a real transfer time (RTT), and a real decompression time (RDT).

19. The computer system of claim 18, further comprising:
determining a distance (D) between the PCT, the PTT, the PDT, and the RCT, the RTT, the RDT.

20. The computer system of claim 19, further comprising:
 determining for a second data block a second preferred compression method in response to the distance being greater than a preset threshold.

\* \* \* \* \*